(12) United States Patent
Kyoung et al.

(10) Patent No.: US 11,038,148 B2
(45) Date of Patent: Jun. 15, 2021

(54) ORGANIC LIGHT-EMITTING DISPLAY APPARATUS INCLUDING NANO-STRUCTURED MIRROR

(71) Applicant: SAMSUNG ELECTRONICS CO., LTD., Suwon-si (KR)

(72) Inventors: Jisoo Kyoung, Seoul (KR); Wonjae Joo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/695,404

(22) Filed: Nov. 26, 2019

(65) Prior Publication Data

US 2020/0227685 A1 Jul. 16, 2020

(30) Foreign Application Priority Data

Jan. 16, 2019 (KR) .................. 10-2019-0005851

(51) Int. Cl.
  *H01L 51/52* (2006.01)
  *H01L 27/32* (2006.01)
  *H01L 51/50* (2006.01)

(52) U.S. Cl.
  CPC ...... *H01L 51/5265* (2013.01); *H01L 27/3244* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/558* (2013.01)

(58) Field of Classification Search
  CPC .......... H01L 51/5265; H01L 51/5036; H01L 51/5056; H01L 51/5072; H01L 51/5088; H01L 51/5092; H01L 2251/301; H01L 2251/558; H01L 27/3244

USPC ......................................................... 257/40
  See application file for complete search history.

(56) References Cited

U.S. PATENT DOCUMENTS 8,080,938 B2   12/2011   Hwang et al.
8,304,788 B2   11/2012   Fukuda
(Continued)

FOREIGN PATENT DOCUMENTS

EP    2084759 A1    5/2008
EP    3 614 447 A1  2/2020

OTHER PUBLICATIONS

European Search Report Issued in Application No. 20152183.8-1211/3683844; dated Jun. 30, 2020.

*Primary Examiner* — Tu-Tu V Ho
(74) *Attorney, Agent, or Firm* — Sughrue Mion, PLLC

(57) ABSTRACT

An OLED apparatus includes a plurality of blue pixels configured to emit blue light, a plurality of green pixels configured to emit green light, and a plurality of red pixels configured to emit red light. Each of the plurality of blue, green, and red pixels includes a reflection layer; a first electrode arranged on the reflection layer; a light-emitting region arranged on the first electrode; and a second electrode arranged on the light-emitting region. An upper surface of the reflection layer of the blue pixel is continuously flat, and an upper surface of the reflection layer of the green pixel and an upper surface of the reflection layer of the red pixel are level with each other. Each of the green pixel or each of the red pixel includes a plurality of nano-structures protruding from a bottom surface of the reflection layer to the upper surface of the reflection layer.

32 Claims, 6 Drawing Sheets

(56) References Cited

U.S. PATENT DOCUMENTS

| | | |
|---|---|---|
| 8,614,698 B2 | 12/2013 | Desieres et al. |
| 9,337,249 B2 * | 5/2016 | Wang .................. H01L 51/5271 |
| 2010/0141612 A1 | 6/2010 | Desieres et al. |
| 2011/0101386 A1 | 5/2011 | Fukuda |
| 2014/0232962 A1 * | 8/2014 | Ishida .................. G02F 1/1333 |
| | | 349/42 |
| 2019/0198817 A1 | 6/2019 | Joo et al. |

* cited by examiner

ORGANIC LIGHT-EMITTING DISPLAY APPARATUS INCLUDING NANO-STRUCTURED MIRROR

CROSS-REFERENCE TO RELATED APPLICATION

This application claims is based on and claims priority from Korean Patent Application No. 10-2019-0005851, filed on Jan. 16, 2019, in the Korean Intellectual Property Office, the disclosure of which is incorporated herein in its entirety by reference.

BACKGROUND

1. Field

The disclosure relates to organic light-emitting display (OLED) apparatuses, and more particularly, to organic light-emitting display apparatuses including a nano-structured mirror that delays a phase of emitted light.

2. Description of the Related Art

An organic light-emitting display apparatus includes red pixels, green pixels, and blue pixels, and may express a full color by combining the pixels. Each of the pixels includes an organic light-emitting device (OLED) and a plurality of thin film transistors that drive the OLED.

The OLED includes an organic light-emitting layer between an anode and a cathode. The organic light-emitting layer may emit red light, green light, blue light, or white light. The OLED may include a resonant structure suitable for each of the pixels to increase light extraction efficiency.

In an organic light-emitting display apparatus including a plurality of OLEDs arranged in an array, the length of micro-cavity for generating a resonance suitable for each pixel is different. In order to manufacture an organic light-emitting display apparatus, when the length of the micro-cavity is controlled to be suitable for each pixel, the heights of electrodes and light-emitting units may vary from pixel to pixel, and thus, a manufacturing process of the organic light-emitting display apparatus is complicated.

Also, since a light-emitting material for emitting light suitable for each pixel is differently formed, the manufacturing process of the light-emitting unit may be complicated.

SUMMARY

Provided are organic light-emitting display apparatuses including micro-cavities formed differently from one another to resonate at different wavelength bands in each pixel by forming nano-structured mirrors at the same depth in reflection layers having reflection surfaces at the same plane.

Additional aspects will be set forth in part in the description which follows and, in part, will be apparent from the description, or may be learned by practice of the presented embodiments.

According to an aspect of the disclosure, there is provided a display apparatus comprising a plurality of blue pixels configured to emit blue light, a plurality of green pixels configured to emit green light, and a plurality of red pixels configured to emit red light, each of the plurality of blue, green, and red pixels comprising: a reflection layer; a first electrode arranged on the reflection layer; a light-emitting region arranged on the first electrode; and a second electrode arranged on the light-emitting region, wherein an upper surface of the reflection layer of each of the plurality of blue pixels is continuously flat, and is level with an upper surface of the reflection layer of the green pixel and an upper surface of the reflection layer of the red pixel, and wherein each of the plurality of green pixels or each of the plurality of red pixels comprises a plurality of nano-structures protruding from a bottom surface of the reflection layer to the upper surface of the reflection layer.

The depth may be in a range from about 70 nm to about 80 nm.

The plurality of nano-structures may comprise circular columns.

The nano-structures may be periodically and regularly arranged.

The circular columns of the green pixels may have a first diameter and a first pitch greater than a second diameter and a second pitch of the circular columns of the red pixels.

The first diameter may be in a range from about 150 nm to about 250 nm and the first pitch is in a range from about 350 nm to about 450 nm.

The second diameter may be in a range from about 50 nm to about 150 nm and the second pitch is in a range from about 200 nm to about 300 nm.

The first electrode of each of the red pixels, the green pixels and the blue pixels are separated from each other, and the second electrode is a common electrode.

The first electrode may be a transparent electrode, and the second electrode may be a semi-transparent electrode configured to reflect a portion of light and transmit a remaining portion of the light.

The second electrode may comprise a reflective metal and has a thickness in a range from about 10 nm to about 20 nm.

The reflection layer may comprise Ag or an alloy includ-

The first electrode may be arranged in areas between the plurality of nano-structures.

The display apparatus may further comprise: a dielectric material is arranged in areas between the plurality of nano-structures.

The display apparatus may further comprise: a dielectric layer that is arranged between the reflection layer and the first electrode, wherein the dielectric layer is arranged in areas between the nano-structures of the green pixels and the red pixels.

The light-emitting region may comprise: a hole injection layer arranged on the first electrode; a hole transfer layer arranged on the hole injection layer; an organic emissive layer arranged on the hole transfer layer and configured to generate blue light, green light, and red light; an electron transfer layer arranged on the organic emissive layer; and an electron injection layer arranged on the electron transfer layer.

The light-emitting regions of the blue pixel, the green pixel, and the red pixel may be continuously formed.

The light-emitting region may be configured to emit white light.

The display apparatus may further comprising: a cap layer arranged on the second electrode.

According to another aspect of the disclosure, there is provided a display apparatus comprising: a plurality of first pixels; and a plurality of second pixels, wherein each of the plurality of first pixels and the plurality of second pixels comprises: a reflection layer; a first electrode arranged on the reflection layer; a light-emitting region arranged on the first electrode; and a second electrode arranged on the light-emitting region, wherein the reflection layer of the plurality of first pixels have a uniform upper surface, and wherein the reflection layer of the plurality of second pixels have a non-uniform upper surface.

The non-uniform upper surface may comprise a plurality of nano-structure protrusions arranged on a bottom surface of the reflection layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
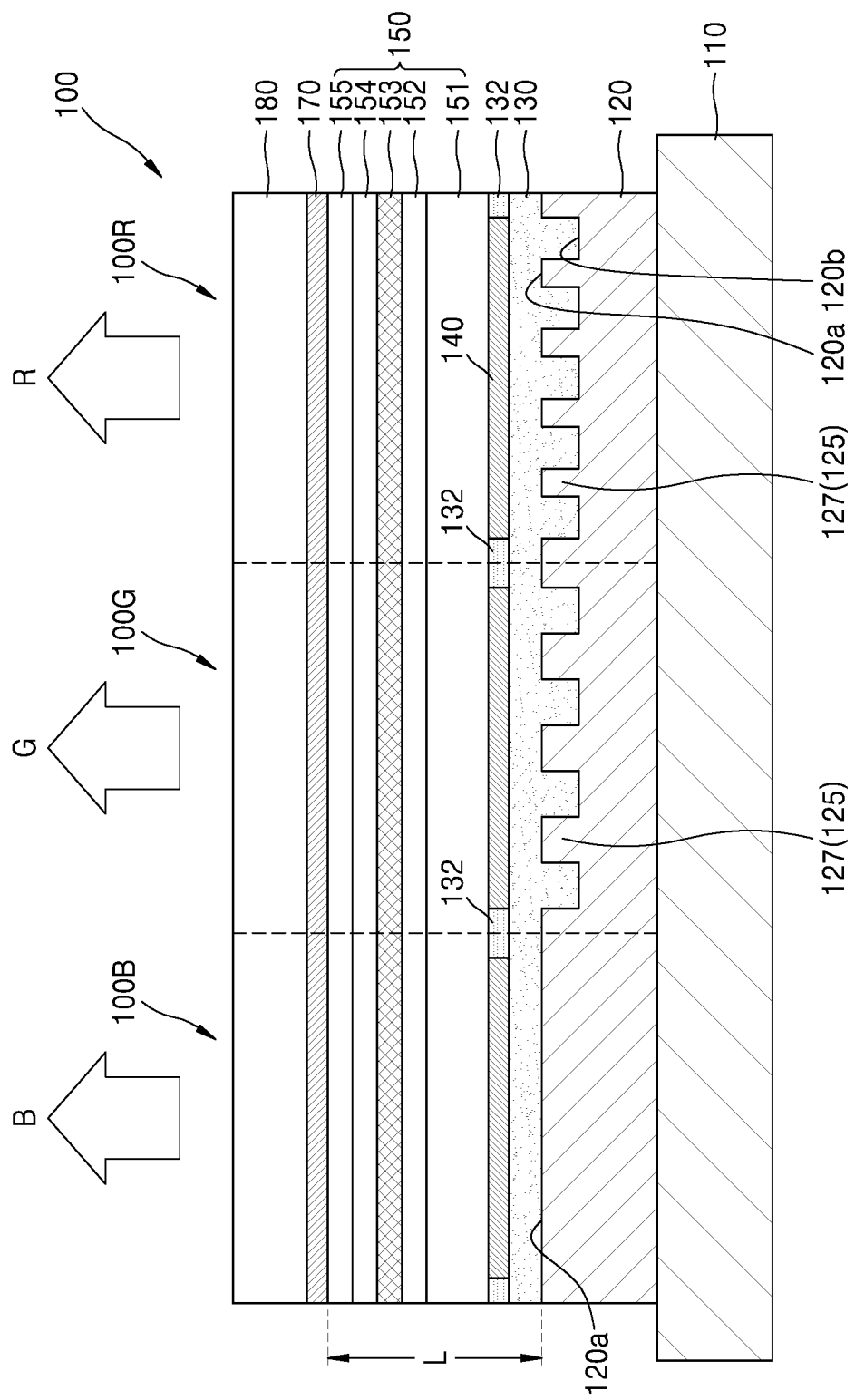
FIG. 1 is a schematic cross-sectional view of a structure of an organic light-emitting display apparatus including a nano-structured mirror, according to an embodiment.

Reference will now be made in detail to embodiments, examples of which are illustrated in the accompanying drawings. In the drawings, thicknesses of layers or regions may be exaggerated for clarity of the specification. The embodiments described below may have different forms and should not be construed as being limited to the descriptions set forth herein.

It will also be understood that when an element is referred to as being "on" or "above" another element, the element may be in direct contact with the other element or other intervening elements may be present.

As used herein, the singular forms are intended to include the plural forms as well, unless the context clearly indicates otherwise. It should be understood that, when a part "comprises" or "includes" an element in the specification, unless otherwise defined, it is not excluding other elements but may further include other elements.

In the specification, the term "above" and similar directional terms may be applied to both singular and plural.

With respect to operations that constitute a method, the operations may be performed in any appropriate sequence unless the sequence of operations is clearly described or unless the context clearly indicates otherwise. The operations may not necessarily be performed in the order of sequence. All examples or example terms (for example, etc.) are simply used to explain in detail the technical scope of the inventive concept, and thus, the scope of the inventive concept is not limited by the examples or the example terms as long as it is not defined by the claims.

FIG. 1 is a schematic cross-sectional view of a structure of an organic light-emitting display apparatus 100 including a nano-structured mirror according to an embodiment.

Referring to FIG. 1, the organic light-emitting display apparatus 100 including a nano-structured mirror may include blue pixels 100B, green pixels 100G, and red pixels 100R that are arranged on a substrate 110. In FIG. 1, for convenience of explanation, only one blue pixel 100B, one green pixel 100G, and one red pixel 100R are depicted, but actually, a plurality of blue pixels 100B, a plurality of green pixels 100G, and a plurality of red pixels 100R may be repeatedly arranged. The plurality of blue pixels 100B, the plurality of green pixels 100G, and the plurality of red pixels 100R may be arranged in a two-dimensional (2D) array.

Each of the blue pixel 100B, the green pixel 100G, and the red pixel 100R may include a reflection layer 120, a dielectric layer 130, a first electrode 140, a light-emitting region 150, and a second electrode 170 sequentially stacked on the substrate 110. A cap layer 180 may be additionally formed on the second electrode 170. The first electrode 140 may be an anode, and the second electrode 170 may be a cathode.

The light-emitting region 150 may include a plurality of layers. For instance, the light-emitting region 150 may include a hole injection layer 151, a hole transfer layer 152, an organic emissive layer 153, an electron transfer layer 154, and an electron injection layer 155 that are sequentially stacked on the first electrode 140. The organic emissive layer 153 may include a blue emissive layer, a green emissive layer, and a red emissive layer that are sequentially stacked. The organic emissive layer 153 may emit white light. In this case, the manufacturing process of the organic emissive layer 153 may be simplified.

However, the embodiment is not limited thereto. For example, the organic emissive layer 153 may include a blue emissive layer, a green emissive layer, and a red emissive layer that are respectively arranged in the blue pixel 100B, the green pixel 100G, and the red pixel 100R.

According to another embodiment, the light-emitting region 150 may include various additional layers as necessary. For example, the light-emitting region 150 may further include an electron block layer between the hole transfer layer 152 and the organic emissive layer 153, and also, may further include a hole block layer between the organic emissive layer 153 and the electron transfer layer 154.

Light may be generated from the organic emissive layer 153 by a combination of holes provided through the hole injection layer 151 and the hole transfer layer 152 with electrons provided through the electron injection layer 155 and the electron transfer layer 154. A wavelength of generated light may be determined by an energy bandgap of a light-emitting material of the organic emissive layer 153.

The first electrode 140 may be a transparent electrode having a property of transmitting light (for example, visible light), and may perform as an anode that provides holes. The second electrode 170 arranged on the light-emitting region 150 is a semi-transparent electrode that reflects a portion of light and transmits the remaining portion of the light, and may perform as a cathode that provides electrons. The first electrode 140 may include a material having a relatively high work function, and the second electrode 170 may include a material having a relatively low work function. For example, the first electrode 140 may include a transparent conductive oxide, such as indium tin oxide (ITO), indium zinc oxide (IZO), or an aluminum zinc oxide (AZO). The second electrode 170 may include a reflective metal having a very thin thickness. For example, the second electrode 170 may be a mixed layer of Ag and Mg or a mixed layer of Al and Li. The second electrode 170 may have a thickness in a range from 10 nm to 20 nm. Since the second electrode 170 has a very thin thickness, a portion of light may pass through the second electrode 170.

The reflection layer 120 may constitute a micro-cavity together with the second electrode 170. The micro-cavity having a length L may be formed between the reflection layer 120 and the second electrode 170 of the organic light-emitting display apparatus 100. For example, light generated from the light-emitting region 150 resonates by travelling back and forth between the reflection layer 120 and the second electrode 170, and afterwards, light corresponding to a resonance wavelength of the micro-cavity may be emitted to the outside through the second electrode 170.

The dielectric layer 130 may include an insulating material that is transparent with respect to visible light. The dielectric layer 130 may include $SiO_2$, $SiN_x$, $Al_2O_3$, or $HfO_2$. The minutely control of the resonance wavelength of the micro-cavity is possible according to the refractive index of the dielectric layer 130. An upper surface of the dielectric layer 130 in pixels 100G, 100G, and 100R may be formed to be coplanar. The dielectric layer 130 may be formed so that a structure formed thereon is planarized, and thus, may be referred to as a planarizing layer.

The cap layer 180 may be a passivation layer. The cap layer 180 may increase color purity, and may increase resonance efficiency. The cap layer 180 may include a polymer. The cap layer 180 may include an organic material, such as N'-diphenyl-benzidine (α-NPD) or N'-tetrakis(4-methoxyphenyl)-benzidine (MeO-TPD). However, the present embodiment is not limited thereto. For example, the cap layer 180 may include an inorganic insulating material.

An upper surface 120a of the reflection layer 120 of the blue pixel 100B may be flat. A nano-structured mirror, which will be described below, is not formed on the reflection layer 120 of the blue pixel 100G.

A nano-structured mirror 125 is formed on the reflection layer 120 of the green pixel 100G and the reflection layer 120 of the red pixel 100R.

Figure 2:
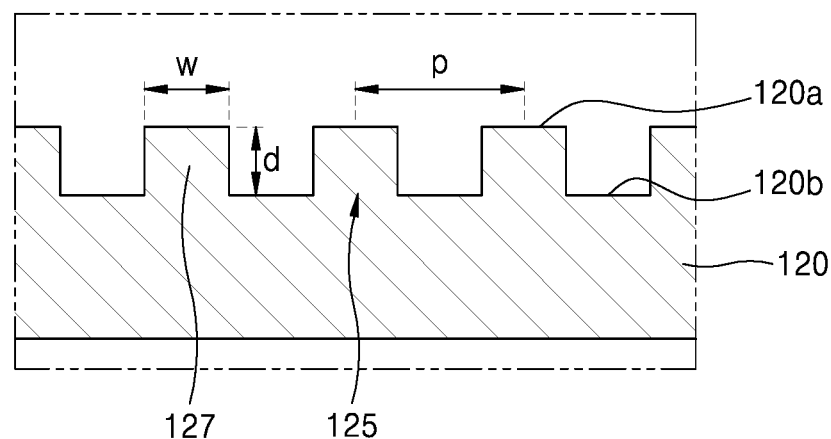
FIG. 2 is a schematic cross-sectional view of a structure of a reflection layer of the green pixel of FIG. 1.
Figure 3:
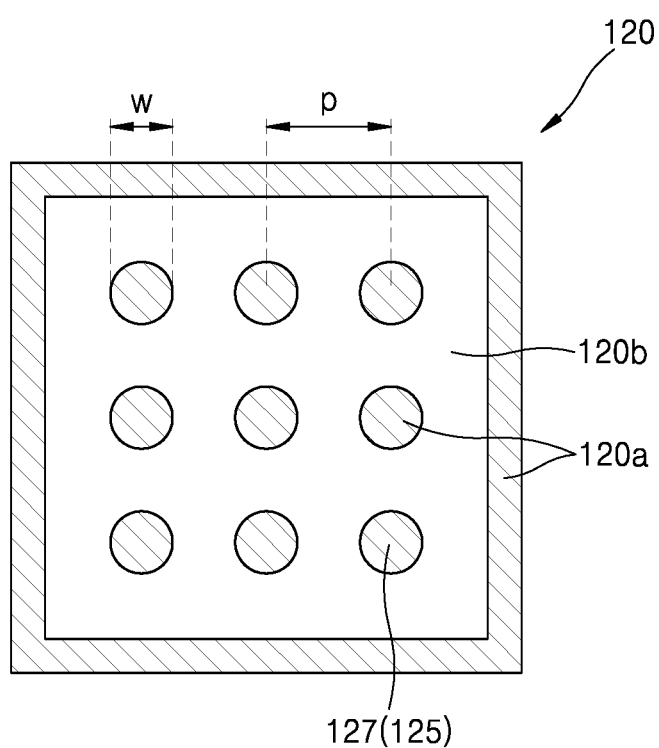
FIG. 3 is a schematic plan view of a reflection layer of a structure of the green pixel of FIG. 1.

FIG. 2 is a cross-sectional view of the reflection layer 120 of the green pixel 100G of FIG. 1. FIG. 3 is a plan view of the reflection layer 120 of the green pixel 100G of FIG. 1. FIGS. 2 and 3 are schematic diagrams for explaining the nano-structured mirror 125 formed on the reflection layer 120.

Referring to FIGS. 1 through 3, the upper surface 120a of the reflection layer 120 of the green pixel 100G and the upper surface 120a of the reflection layer 120 of the red pixel 100R may be formed to be level with the upper surface 120a of the reflection layer 120 of the blue pixel 100G. That is, on an upper surface of the substrate 110, a height to the upper surface 120a of the reflection layer 120 of the green pixel 100G and a height to the upper surface 120a of the reflection layer 120 of the red pixel 100R may be equal to a height to the upper surface 120a of the reflection layer 120 of the blue pixel 100G.

The nano-structured mirror 125 including a plurality of nano-structures is formed to have a bottom surface 120b that is formed by etching the reflection layer 120 to a predetermined depth d from the upper surface 120a of the reflection layer 120. The nano-structures may be circular columns, but the embodiment is not limited thereto. The nano-structures may be quadrangle columns, oval columns, or polygonal columns. Hereinafter, the embodiment in which the nano-structures are circular columns 127 is described.

The circular columns 127 may be regularly and periodically arranged to have a 4-fold symmetry characteristic to prevent the micro-cavity from being dependency on polarization. When the micro-cavity has polarization dependency, light of a specific polarization component may resonate, and thus, the light emission efficiency of the organic light-emitting display apparatus 100 may be reduced.

The optical characteristics of the nano-structures may be determined by a diameter w, a height d, and a pitch p of the circular columns 127. The diameter w, the height d, and the pitch p of the circular columns 127 in each pixel region may be constant. The height d of the circular columns 127 may be an etched depth from the upper surface 120a of the reflection layer 120. Also, the height d of the circular columns 127 may be a height of the circular columns 127 from the bottom surface 120b of the reflection layer 120.

When the nano-structures are polygonal columns, the optical characteristics of the nano-structures may be also determined by a width, a height, and a pitch of the polygonal columns.

A plurality of nano-structures are formed on the upper surface 120a of the reflection layer 120 of the red pixel 100R as on the upper surface 120a of the reflection layer 120 of the green pixel 100G. The shape of the nano-structures of the red pixel 100R may be similar to that of the nano-structures of the green pixel 100G of FIGS. 2 and 3. A height of the nano-structures of the red pixel 100R may be equal to the height d of the nano-structures of the green pixel 100G. The diameter and the pitch of the nano-structures of the red pixel 100R may be less than the diameter w and the pitch p of the nano-structures of the green pixel 100G.

A resonance wavelength of the micro-cavity of each pixel may be determined by an optical length of a structure of the micro-cavity. For example, when the resonance wavelength of the micro-cavity is A, an optical length of the micro-cavity may be $n\lambda/2$ (where n is a natural number). The optical length of the micro-cavity may be determined by a sum of optical thicknesses of the dielectric layer 130, the first electrode 140, and the light-emitting region 150, a phase delay by the second electrode 170, and a phase delay by the nano-structured mirror 125 formed in the reflection layer 120. Here, the optical thicknesses of the dielectric layer 130, the first electrode 140, and the light-emitting region 150 are not simple physical thicknesses but thicknesses taking into consideration of refractive indexes of materials of the dielectric layer 130, the first electrode 140, and the light-emitting region 150. According to an embodiment, the optical length of the micro-cavity or the resonance wavelength of the micro-cavity may be controlled by controlling the phase delay by the reflection layer 120 after fixing the optical thicknesses of the dielectric layer 130, the first electrode 140, and the light-emitting region 150 and the phase delay by the second electrode 170.

Since there are no nano-structures for a phase delay on the upper surface 120a of the reflection layer 120 of the blue pixel 100G, the resonance wavelength of the micro-cavity may be determined as designed.

The resonance wavelength of the micro-cavity of the green pixel 100G may be determined by the diameter w, the height d, and the pitch p of the circular columns 127. In other words, assuming that the resonance wavelength of the micro-cavity of the green pixel 100G is A, the diameter w, the height d, and the pitch p of the circular columns 127 may be selected so that an optical length of the micro-cavity L satisfies nλ/2 (where n is a natural umber). For example, the diameter w of the circular columns 127 of the green pixel 100G may be in a range of 150 nm to 250 nm, the height d of the circular columns 127 may be in a range of 70 nm to 80 nm, and the pitch p of the circular columns 127 may be in a range of 350 nm to 450 nm. When the height w of the circular columns 127 is less than 70 nm, blue light may be emitted from the red pixel 100R, and thus, the color purity of the organic light-emitting display apparatus 100 may be reduced. When the height w of the circular columns 127 is greater than 80 nm, optical loss may be increased in the green pixel 100G.

When the size of the circular columns 127 is less than the resonance wavelength, incident light may resonate in a periphery of the circular columns 127, and thus, a light resonance nano-structure is formed. In particular, an electric field component of the incident light may not penetrate into spaces between the circular columns 127 and only a magnetic field component may resonate in the periphery of the circular columns 127. Accordingly, the light resonance nano-structure formed in the spaces between the circular columns 127 may be a cylindrical type magnetic resonator in which a magnetic component of incident light resonates in the periphery of the circular columns 127. As a result, a large phase delay greater than a simple phase delay caused by an effective optical distance (d×n) which is determined by multiplying the height d of the circular columns 127 by a refractive index n of the circular columns 127 may be generated in the circular columns 127.

The resonance wavelength of the micro-cavity L of the red pixel 100R may be determined by the diameter w, the height d, and the pitch p of the circular columns 127. In other words, assuming the resonance wavelength of the micro-cavity L of the red pixel 100R is A, the diameter w, the height d, and the pitch p of the circular columns 127 may be selected so that an optical length of the micro-cavity L satisfies nλ/2 (where n is a natural umber). For example, the diameter w of the circular columns 127 of the red pixel 100R may be in a range of 50 nm to 150 nm, the height d of the circular columns 127 may be in a range of 70 nm to 80 nm, and the pitch p of the circular columns 127 may be in a range of 200 nm to 300 nm.

According to another embodiment, the circular columns 127 may have a 4-fold symmetry characteristic, but may be irregularly or non-periodically arranged.

Referring to FIG. 1, the first electrodes 140 are separated from each other. Gaps between the first electrodes 140 are filled with an insulating material 132. The insulating material 132 may be filled as the lowermost layer (for example, a hole injection layer) of a light-emitting structure. However, the embodiment is not limited thereto. For example, the insulating material 132 may include a material like the dielectric layer 130. The light-emitting region 150 and the second electrode 170 may continuously cover the entire region of the organic light-emitting display apparatus 100 above the first electrodes 140 without separating from each other on the pixels. The second electrode 170 may be a common electrode. When a voltage is applied to the second electrode 170, light may be emitted from a corresponding pixel by selecting the first electrode 140, but the present embodiment is not limited thereto. Together with the separation of the first electrodes 140, the dielectric layer 130 and the reflection layer 120 may also be separated by being etched together with the first electrode 140.

Figure 4:
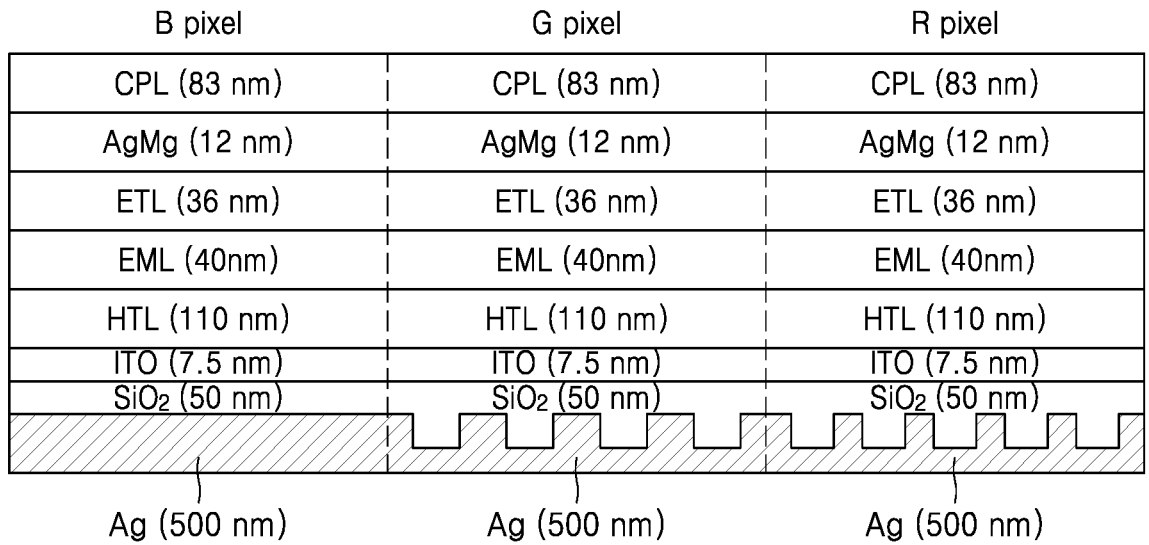
FIG. 4 is a diagram showing an example thickness of a material layer of an organic light-emitting display apparatus according to an embodiment.

FIG. 4 is a diagram showing an example thickness of a material layer of the organic light-emitting display apparatus 100 according to an embodiment. A diameter, a pitch, and a depth (height) of a circular column of a green pixel respectively are 225 nm, 400 nm, and 75 nm. A diameter, a pitch, and a depth (height) of a circular column of a red pixel respectively are 100 nm, 225 nm, and 75 nm.

Figure 5:
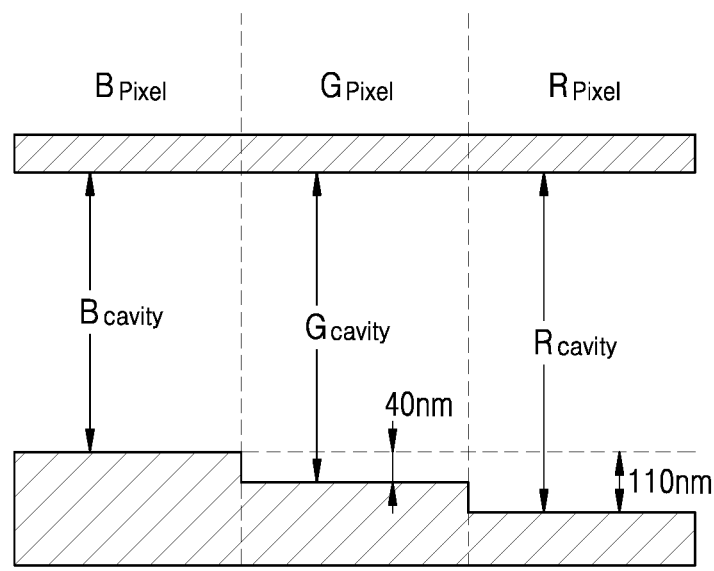
FIG. 5 is a simplified cross-sectional view of a structure of an organic light-emitting display apparatus according to a comparative example.

FIG. 5 is a simplified cross-sectional view of a structure of an organic light-emitting display apparatus according to a comparative example. In FIG. 5, the lengths of the micro-cavities between a reflection layer and a second electrode are different according to pixels. The reflection layers of the blue pixels B, the green pixel G, and the red pixels R all have flat surfaces. The reflection layers of the green pixel G and the red pixel are respectively etched by 40 nm and 110 nm from the length of the micro-cavity of the blue pixel B.

Figure 6:
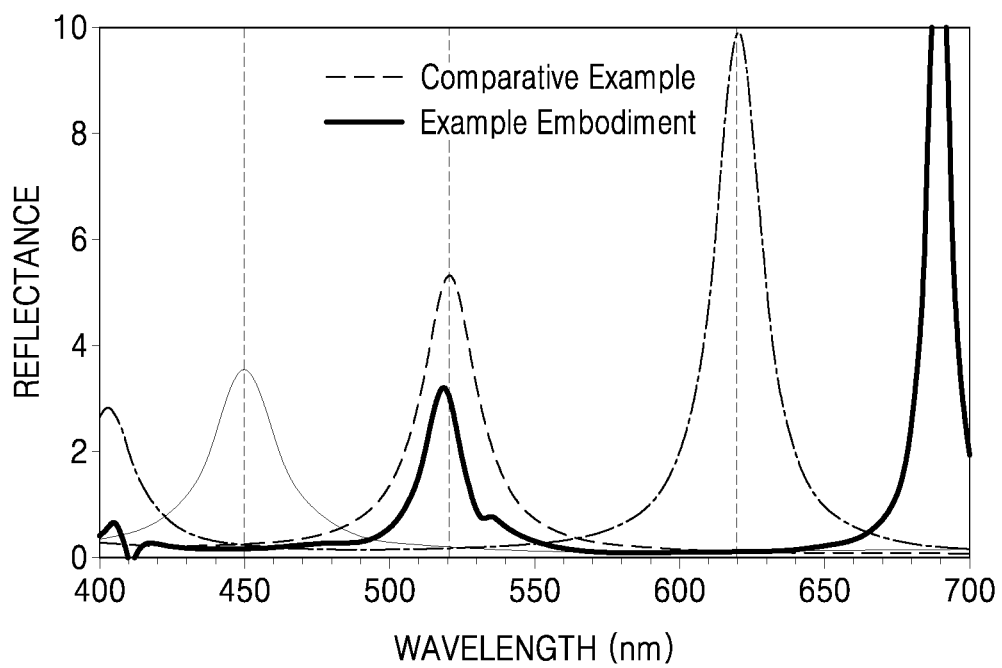
FIG. 6 is a graph showing the reflectivity of emission light of a display apparatus according to a comparative example and the reflectivity of green light of an organic light-emitting apparatus according to an embodiment.

FIG. 6 is a graph of showing the reflectivity of emission light of a display apparatus according to a comparative example and the reflectivity of green light of an organic light-emitting apparatus according to an embodiment. The reflectivity indicates an amount of light emitted through a second electrode. The emission light according to the comparative example has peaks of blue light (450 nm), green light (520 nm), and red light (620 nm). The green light according to the embodiment has a wavelength of approximately 520 nm as indicated by a bold line.

Referring to FIG. 6, although the reflectivity of green light according to the embodiment is relatively low when compared to that of green light according to the comparative example at a wavelength of approximately 520 nm, it is seen that the green light according to the embodiment has a reflectivity that may be used as a light-emitting region of the organic light-emitting display apparatus.

Figure 7:
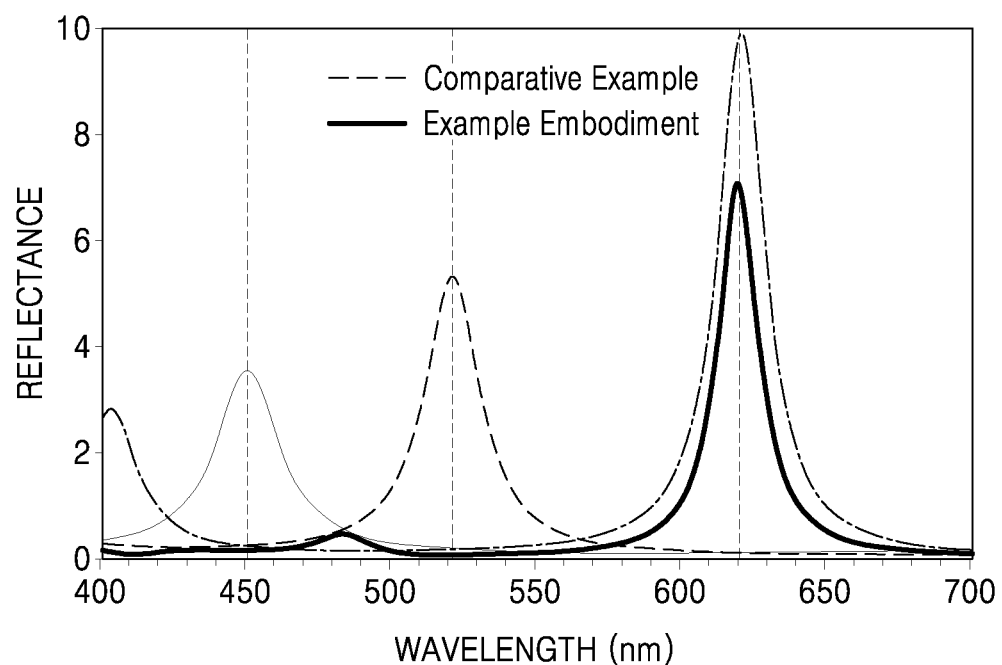
FIG. 7 is a graph showing the reflectivity of emission light of a display apparatus according to a comparative example and the reflectivity of red light of an organic light-emitting apparatus according to an embodiment.

FIG. 7 is a graph of showing the reflectivity of emission light of a display apparatus according to a comparative example and the reflectivity of red light of an organic light-emitting apparatus according to an embodiment. The emission light has peaks of blue light (450 nm), green light (520 nm), and red light 620 nm), the red light according to the embodiment as indicated by a bold line.

Referring to FIG. 7, although the reflectivity of red light according to the present embodiment is relatively low when compared with that of red light according to the comparative example at a wavelength of approximately 620 nm, it is seen that the red light according to the present embodiment has a reflectivity that may be used as a light-emitting region of the organic light-emitting display apparatus.

Figure 8:
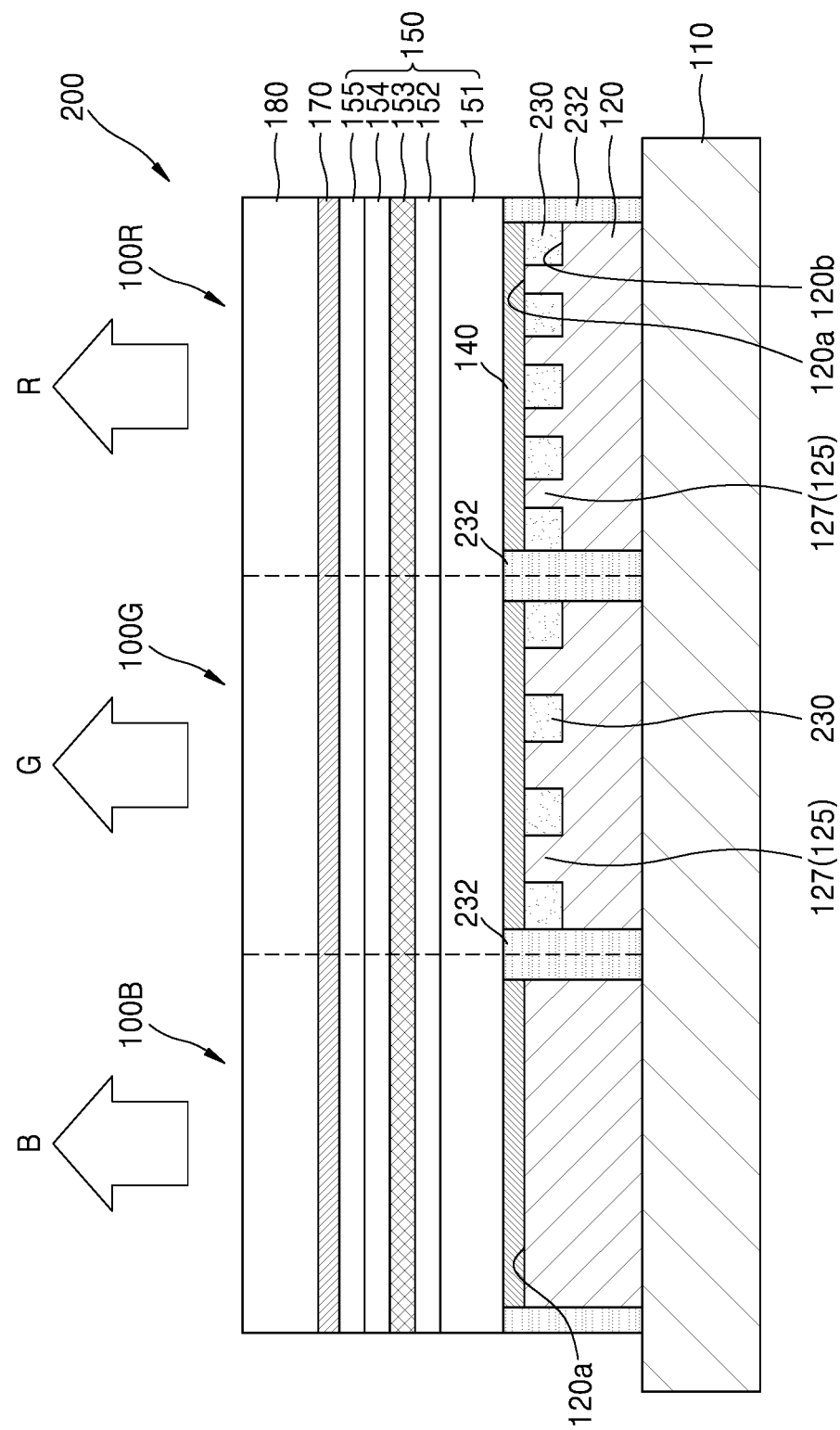
FIG. 8 is a schematic cross-sectional view of a structure of an organic light-emitting display apparatus according to another embodiment.

FIG. 8 is a schematic cross-sectional view of a structure of an organic light-emitting display apparatus 200 according to another embodiment. Like reference numerals are used to indicate elements substantially identical to the elements of FIG. 1, and the descriptions thereof will be omitted.

Referring to FIG. 8, the first electrodes 140 are arranged directly on the reflection layers 120. Spaces between the circular columns 127 of the reflection layers 120 of the green pixel 100G and the red pixel 100R are filled with a dielectric layer 230. The first electrodes 140 are separated from each other by pixels and the reflection layer 120 are separated from each other by pixels. Separated spaces of the first electrodes 140 and the reflection layers between pixels 120 are filled with an insulating material 232. The insulating material 232 may include a hole transfer layer material or an insulating material. The insulating material may include $SiO_2$, $SiN_x$, $Al_2O_3$, or $HfO_2$. The operation of the nano-structured mirror 125 formed in the reflection layer 120 may be well understood from the embodiment described above, and thus, the detailed descriptions thereof will be omitted. Since the reflection layer 120 and the first electrode 140 in the pixel are electrically connected, a voltage may be applied to the reflection layer 120 by an application of voltage to the first electrode 140.

Figure 9:
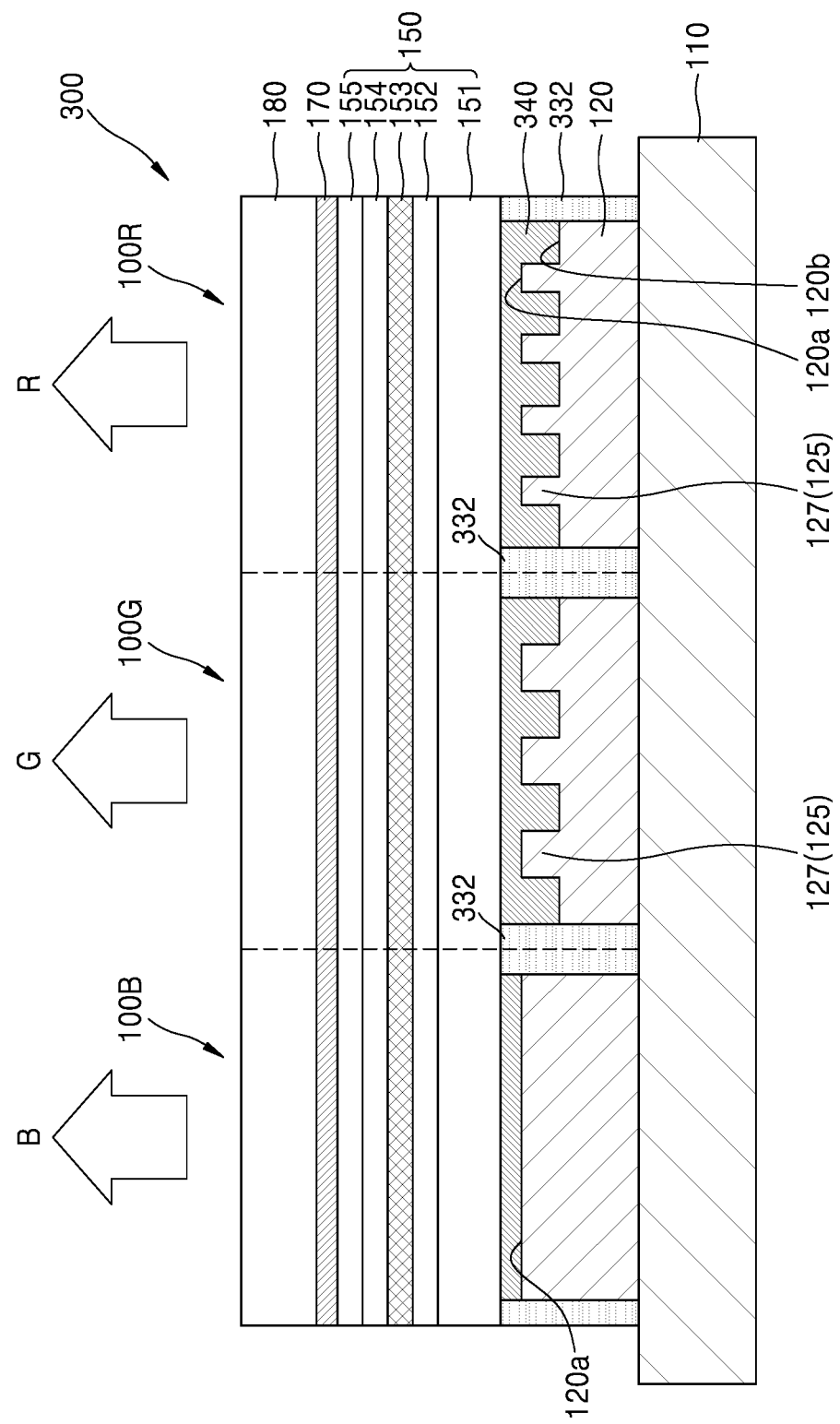
FIG. 9 is a schematic cross-sectional view of a structure of an organic light-emitting display apparatus according to another embodiment.

FIG. 9 is a schematic cross-sectional view of a structure of an organic light-emitting display apparatus 300 according to another embodiment. Like reference numerals are used to indicate elements substantially identical to the elements of FIG. 1, and the descriptions thereof will be omitted.

Referring to FIG. 9, a first electrode 340 is arranged directly on the reflection layer 120. Spaces between the circular columns 127 of the green pixel 100G and the red pixel 100R on the bottom surfaces 120b of the reflection layer 120 are filled with extending portions of the first electrode 340. The first electrode 340 and the reflection layer 120 are separated from each other by pixels. Separated spaces of the first electrodes 340 and the reflection layers 120 between pixels are filled with an insulating material 332.

The insulating material 332 may include a hole transfer layer material or an insulating material. The insulating material may include $SiO_2$, $SiN_x$, $Al_2O_3$, or $HfO_2$. The operation of the nano-structured mirror 125 formed in the reflection layer 120 may be well understood from the embodiment described above, and thus, the detailed descriptions thereof will be omitted. Since the reflection layer 120 and the first electrode 140 in the pixel are electrically connected, a voltage may be applied to the reflection layer 120 by an application of voltage to the first electrode 340.

In the organic light-emitting display apparatus according to an embodiment, upper surfaces of reflection layers of a green pixel and a red pixel are level with an upper surface of the reflection layer of a blue pixel, and in order to form a resonance wavelength of the green pixel and a resonance wavelength of the red pixel, nano-structured columns having the same depth may be formed on the upper surface of the reflection layer through a single patterning process, and thus, the manufacturing process of the organic light-emitting display apparatus may be simplified.

Also, a light-emitting layer may emit white light, and thus, the manufacturing of the light-emitting layer of the organic light-emitting display apparatus may be simplified.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising a plurality of blue pixels configured to emit blue light, a plurality of green pixels configured to emit green light, and a plurality of red pixels configured to emit red light, each of the plurality of blue, green, and red pixels comprising:
    a reflection layer;
    a first electrode arranged on the reflection layer;
    a light-emitting region arranged on the first electrode; and
    a second electrode arranged on the light-emitting region,
    wherein an upper surface of the reflection layer of each of the plurality of blue pixels is continuously flat, and is level with an upper surface of the reflection layer of the green pixel and an upper surface of the reflection layer of the red pixel,
    wherein each of the plurality of green pixels or each of the plurality of red pixels comprises a plurality of nano-structures protruding from a bottom surface of the reflection layer to the upper surface of the reflection layer, and
    wherein the plurality of nano-structures have same level and length as each other.

2. The display apparatus of claim 1, wherein a depth of the nano-structures is in a range from about 70 nm to about 80 nm.

3. The display apparatus of claim 1, wherein the plurality of nano-structures comprise circular columns.

4. The display apparatus of claim 3, wherein the nano-structures are periodically and regularly arranged.

5. The display apparatus of claim 3, wherein the circular columns of the green pixels have a first diameter and a first pitch greater than a second diameter and a second pitch of the circular columns of the red pixels.

6. The display apparatus of claim 5, wherein the first diameter is in a range from about 150 nm to about 250 nm and the first pitch is in a range from about 350 nm to about 450 nm.

7. The display apparatus of claim 5, wherein the second diameter is in a range from about 50 nm to about 150 nm and the second pitch is in a range from about 200 nm to about 300 nm.

8. The display apparatus of claim 1, wherein the first electrode of each of the red pixels, the green pixels and the blue pixels are separated from each other, and the second electrode is a common electrode.

9. The display apparatus of claim 1, wherein the first electrode is a transparent electrode, and the second electrode is a semi-transparent electrode configured to reflect a portion of light and transmit a remaining portion of the light.

10. The display apparatus of claim 9, wherein the second electrode comprises a reflective metal and has a thickness in a range from about 10 nm to about 20 nm.

11. The display apparatus of claim 10, wherein the reflection layer comprises Ag or an alloy including Ag.

12. The display apparatus of claim 1, wherein the first electrode is arranged in areas between the plurality of nano-structures.

13. The display apparatus of claim 1, further comprising:
    a dielectric material is arranged in areas between the plurality of nano-structures.

14. The display apparatus of claim 1, further comprising:
    a dielectric layer that is arranged between the reflection layer and the first electrode,
    wherein the dielectric layer is arranged in areas between the nano-structures of the green pixels and the red pixels.

15. The display apparatus of claim 1, wherein the light-emitting region comprises:
    a hole injection layer arranged on the first electrode;
    a hole transfer layer arranged on the hole injection layer;
    an organic emissive layer arranged on the hole transfer layer and configured to generate blue light, green light, and red light;
    an electron transfer layer arranged on the organic emissive layer; and
    an electron injection layer arranged on the electron transfer layer.

16. The display apparatus of claim 1, wherein the light-emitting regions of the blue pixel, the green pixel, and the red pixel are continuously formed.

17. The display apparatus of claim 1, wherein the light-emitting region is configured to emit white light.

18. The display apparatus of claim 1, further comprising:
    a cap layer arranged on the second electrode.

19. A method of manufacturing a display apparatus, the method comprising:
    forming a reflection layer on a substrate;
    forming a first electrode on the reflection layer;
    forming a light-emitting region on the first electrode; and forming a second electrode on the light-emitting region,
wherein the forming a reflection layer on a substrate comprises forming flatwise a region of the reflection layer corresponding to a blue pixel and a plurality of protrusions in a region of the reflection layer corresponding to green and red pixels, and
wherein the plurality of nano-structures have same level and length as each other.

20. The method of claim 19, wherein the reflection layer is in contact with the first electrode.

21. The method of 20, wherein areas between the plurality of protrusions are filled with the first electrode.

22. The method of claim 19, further comprising forming a dielectric layer between the reflection layer and the first electrode, the dielectric layer filling areas between the plurality of protrusions.

23. The method of claim 19, wherein a width of the protrusions in the region corresponding to the green pixel is different from that of the protrusions in the region corresponding to the red pixel.

24. The method of claim 23, wherein the protrusions in the region corresponding to the green pixel have a first diameter and a first pitch greater than a second diameter and a second pitch of the protrusions in the region corresponding to the red pixel.

25. The method of claim 19, wherein the plurality of protrusions include nano-structures periodically and regularly arranged.

26. The method of claim 19, wherein the first electrode includes a first portion corresponding to the red pixel, a second portion corresponding to the green pixel and a third portion corresponding to the blue pixel, the first to third portions being separated from each other.

27. The method of claim 19, wherein the first electrode is a transparent electrode, and the second electrode is a semi-transparent electrode configured to reflect a portion of light and transmit a remaining portion of the light.

28. The method of claim 27, wherein the second electrode comprises a reflective metal and has a thickness in a range from about 10 nm to about 20 nm.

29. The method of claim 19, wherein the light-emitting region comprises:
   a hole injection layer arranged on the first electrode;
   a hole transfer layer arranged on the hole injection layer;
   an organic emissive layer arranged on the hole transfer layer and configured to generate blue light, green light, and red light;
   an electron transfer layer arranged on the organic emissive layer; and
   an electron injection layer arranged on the electron transfer layer.

30. The method of claim 19, wherein the light-emitting regions of the blue pixel, the green pixel, and the red pixel are continuously formed.

31. The method of claim 19, wherein the light-emitting region is configured to emit white light.

32. The method of claim 19, further comprising:
   forming a cap layer on the second electrode.

* * * * *